United States Patent [19]
Gontowski, Jr.

[11] Patent Number: 5,877,914
[45] Date of Patent: Mar. 2, 1999

[54] AMPLIFIER OUTPUT CLAMPING SCHEME

[75] Inventor: Walter S. Gontowski, Jr., Thompson, Conn.

[73] Assignee: STMicroelectronics, Inc., Carrollton, Tex.

[21] Appl. No.: 782,524

[22] Filed: Jan. 10, 1997

Related U.S. Application Data

[63] Continuation of Ser. No. 470,975, Jun. 6, 1995, abandoned.

[51] Int. Cl.$^6$ ............................ G11B 5/596; H03F 3/26
[52] U.S. Cl. ............................ 360/78.12; 360/77.02; 360/78.04; 330/267
[58] Field of Search ............................ 330/149, 267; 360/77.02, 78.04, 78.12

[56] References Cited

U.S. PATENT DOCUMENTS

| | | | |
|---|---|---|---|
| 4,286,227 | 8/1981 | Sato | 330/267 |
| 5,216,382 | 6/1993 | Ito | 330/267 |
| 5,297,024 | 3/1994 | Carobolante | 360/67 |
| 5,337,012 | 8/1994 | Dijkmans | 330/267 |

*Primary Examiner*—Alan Faber
*Attorney, Agent, or Firm*—Theodore E. Galanthay; Lisa K. Jorgenson; Peter J. Thoma

[57] ABSTRACT

An amplifier in which a clamping circuit is an integral part of the output stage structure is used as a voice coil driver for positioning the heads of a memory disk drive. The output stage, operating in class AB, comprises two bipolar transistors, the source and the sink transistors, serially connected between a power supply and a ground terminal, the serial connection between the emitter of the first transistor and the collector of the second transistor being the output terminal of the output stage. The base terminals of the two output transistors are connected to a bias circuit and to an input transistor, used as the signal control element. The clamping circuit is directly connected with the base terminals of the output transistors to limit the voltage on said base terminals between a first and a second voltage reference.

14 Claims, 2 Drawing Sheets

AMPLIFIER OUTPUT CLAMPING SCHEME

This application is a continuation of application Ser. No. 08/470,975, filed Jun. 6, 1995, now abandoned.

BACKGROUND OF THE INVENTION

1. Field of the Invention

This invention pertains to improvements in electronic circuitry used in moving read/write heads in a memory disk system of the type used in computer systems or the like, and, more particularly, to improvements in such circuitry for providing linear drive signals to a "voice coil" of such system.

2. Description of the Prior Art

A coil that serves as an actuator to move and position the read/write heads of a memory disk drive of the type used in a computer system is widely referred to as a "voice coil" or "voice coil motor". Such memory disk drives are typically found in hard-disk drives, CD ROM drives, and so on. The actuator coils are known in the art as "voice coil" due to their similarity to coils commonly used in audio loud speaker systems or the like. Such voice coils are operated in a manner similar to acoustic voice coils since a positive current applied to the coil produces a corresponding positive direction of motion of the read/write head. A negative current applied to the voice coil produces a corresponding negative displacement of the read/write head.

The purpose of the voice coil is to precisely move the head assembly to the required location on the hard drive platter at high velocities, while insuring that the head does not overshoot the target and require corrective action in the control loop. The low access time required in today's high speed computing systems demands that the control system responsible for this function be optimized for fast response times.

An electrical schematic diagram of a typical voice coil driver system 20 of the prior art is shown in FIG. 1. The voice coil 21 shown may be a part of the read/write head mechanism of a disk drive of the type used in personal, portable, or other computers. Two amplifiers 23 and 24 are provided for delivering drive current to a voice coil 21.

A positioning voltage Vp is applied to the circuit 20 from a servocontroller with which the voice coil system 20 is associated. Ideally, the relationship between Vp and the current applied to the voice coil is directly proportional.

The amplifiers 23 and 24 are generally connected to serve as a bridge driver for the voice coil 21. It will be appreciated that the driver circuit 20 is a high performance device, and, therefor requires precise components for implementation. Moreover, in order to achieve the precision needed, typically, a large number of operational amplifiers are employed, again, each with precision components. The operational amplifier 26 is used as an error amplifier to determine the voltage difference between a known voltage reference $V_{ref}$, and a feedback signal from the loop that provides information about the current that flows in the voice coil and in the sensing resistor $R_{SENSE}$.

To prevent operational amplifiers and driver stages from entering saturation it is necessary to limit the swing of input and/or output signals of said amplifiers or driver stages. In fact, one main issue to deal with when designing control loops to achieve fast transient response, is to ensure that none of the active elements in the control loop enter saturation. This is especially true for the output stage driving the voice coil. Once an amplifier or driver stage becomes saturated, the response time is severely affected due to the finite time required to get out of saturation.

A well-known scheme for limiting the output voltage of an operational amplifier, used also in the L6244, an SGS-THOMSON Microelectronics voice coil motor driver circuit for hard disk drives, is depicted in FIG. 2. A1 is a tropical operational amplifier configured as an inverting amplifier with a gain of 10 V/V. This amplifier is designated an error amplifier and is used to determine the voltage difference between a known reference or control signal, and a feedback signal from the loop that provides information about the voice coil motor current. The difference in voltage between these two signals is the error signal. This error signal is then used to control the conduction of the output drivers to control the motor current.

To ensure that the output stage of the operational amplifier does not saturate, the output of the error amplifier is usually clamped to define the upper and lower boundaries of the output voltage. As shown in FIG. 2, four diodes are placed around the loop to limit or clamp the output swing.

In operation, if the output of the amplifier is driven high, both diodes D1 and D2 conduct when the output voltage exceeds two diode drops (approximately 1.4 V) above the reference voltage potential, or 5 V in this example. Analogously if the output of the amplifier is driven low, both diodes D3 and D4 conduct when the output voltage becomes two diode drops lower than the reference voltage of 5 V.

In FIG. 3 are shown waveforms of two signals employed in the circuit of FIG. 2. In particular Va is an input signal applied on the input terminal of the amplifier A1 and $V_{out}$ is the corresponding output signal present on the output of the amplifier. In this example the output was severely overdriven to clearly demonstrate the clamping capability of this scheme. In practice, during normal operations, the signal levels and gains are selected such that the maximum signal levels are somewhat near the compliance levels of the clamps.

While this clamping scheme is effective, it does have some main drawbacks. The clamping voltage can only be selected in multiples of diode drops. Moreover the diodes exhibit a negative temperature coefficient affecting the accuracy of the clamp voltage with temperature. Another drawback of the scheme of FIG. 2 is that the absolute value of the clamp voltage is a function of the processing of the diode drops and decreases in accuracy as the number of diodes is increased.

SUMMARY OF THE INVENTION

In light of the above, it is, therefore, an object of the invention to provide an improved voice coil driver that enables increased precision and speed in positioning the read/write heads of a memory disk drive of the type used in computer systems or the like.

It is another object of the present invention to provide an amplifier or a driver stage in which the clamping circuit is an integral part of the output stage structure.

It is a further object of the present invention to provide a clamping circuit in an output stage of an amplifier or driver stage in which the clamping voltages can be set to any value desired within the boundaries of the headroom available.

The invention may be implemented into an output stage, operating in class AB, of an operational amplifier. The output stage comprises two transistors, each having first and second terminals and a control terminal, serially connected between a power supply and a ground terminal, one serial connection between said first and second terminals being connected to the output terminal of the output stage. The control terminals of the two output transistors are connected to a bias circuit and to an input transistor, used as the signal control element. According to the present invention a clamping circuit is directly connected with the base terminals of the output transistors to limiting the voltage on said base terminals between a first and a second voltage reference.

Other objects and advantages of the present invention will be apparent to those of ordinary skill in the art having reference to the following specification together with the drawings.

DETAILED DESCRIPTION OF THE PREFERRED EMBODIMENT

Figure 1:
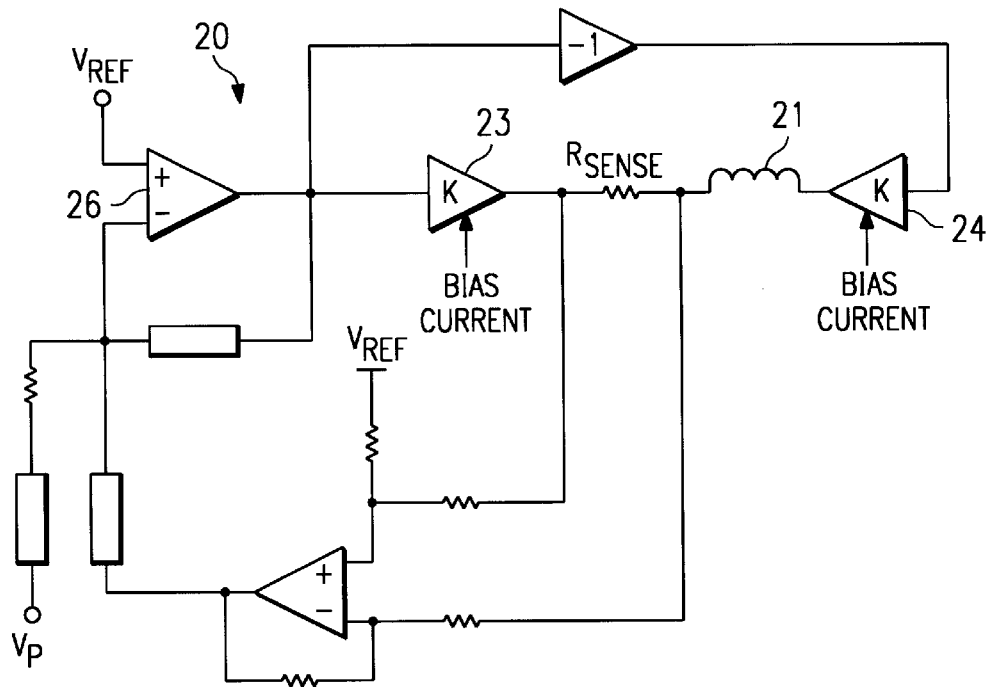
FIG. 1 is a schematic diagram of a voice coil driver system, in accordance with the prior art.
Figure 2:
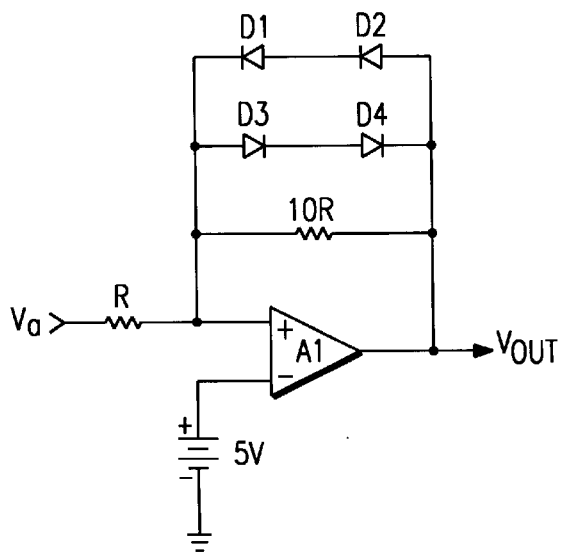
FIG. 2 is an electrical diagram, in schematic form, of a conventional scheme for limiting the output voltage of an operational amplifier.
Figure 3:
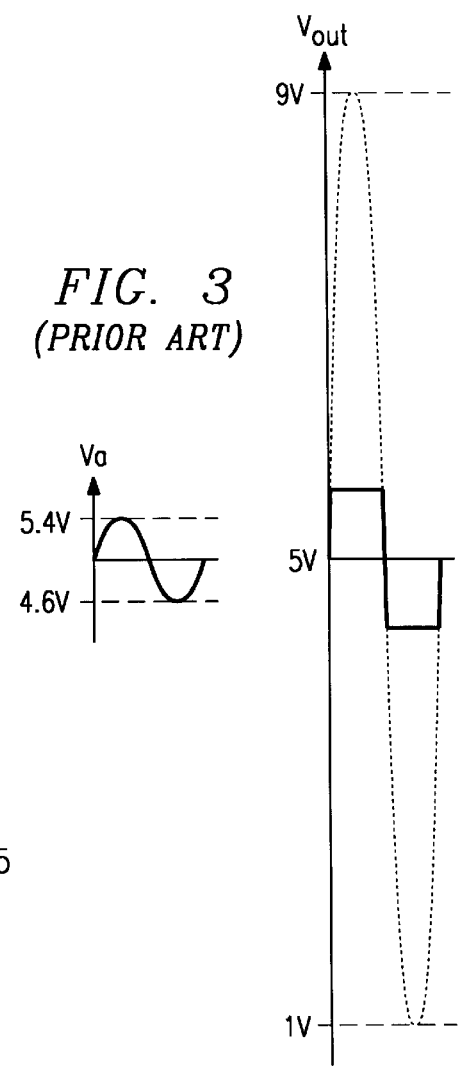
FIG. 3 is a plot of waveforms of two signals employed in the circuit of FIG. 2.
Figure 4:
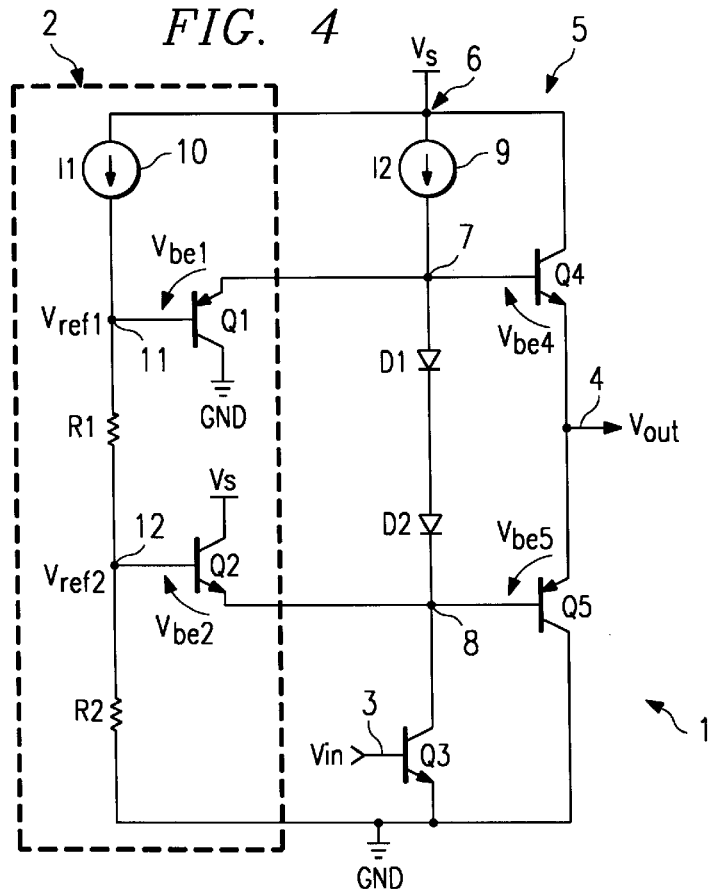
FIG. 4 is an electrical diagram, in schematic form, of an output stage of an amplifier including a clamping circuit, according to the preferred embodiment of the invention.

With reference to FIG. 4, an amplifier's output stage structure 1 according to the preferred embodiment of the invention will now be described in detail. According to this embodiment of the invention, output stage 1 is a class AB output stage structure connected between Vs power supply and ground GND and has an input terminal 3 and an output terminal 4. Output stage 1 incorporates, connected between Vs power supply and ground GND, three legs: an output leg 5, an input-biasing leg 6 that provides linear bias and input signal for the output leg and a clamping circuit leg 2.

The output leg 5 comprises two serially connected output bipolar transistors Q4 and Q5. In this embodiment Q4 is an NPN type transistor and Q5 is a PNP type transistor, each having collector, base and emitter terminals. The collector of transistor Q4 is connected to power supply Vs, and the emitter is connected to the emitter of transistor Q5 at output node 4. The collector of transistor Q5 is connected to ground.

The input leg 6 has, serially connected between power supply Vs and ground GND, a current generator 9, a first diode D1 and a second diode D2, and a bipolar NPN input transistor Q3. The current generator 9 conducts a current I2 from the power supply Vs into node 7, common to the base of output transistor Q4 and to the anode of the first diode D1. The cathode of the diode D1 is connected to the anode of the second diode D2, which is connected on its other end at the node 8 common to the base of the second output transistor Q5 and to the collector of the input transistor Q3. The emitter of the transistor Q3 is grounded and its base is the input terminal 3 of the output stage.

The clamping circuit leg 2 is connected to the base terminals of the output transistors Q4 and Q5 for limiting the voltage on said base terminals between a first and a second voltage reference. This leg includes a current generator 10 that conducts a current I1 from the Vs power supply into two serially connected resistors R1 and R2 generating two different voltage references $V_{ref1}$ and $V_{ref2}$ on the two nodes 11 and 12. One terminal of the current generator 10 is connected to the power supply Vs while the other terminal is connected, at node 11, to the base of a first limiting transistor Q1 and to a terminal of the first resistor R1. The emitter terminal of the transistor Q1 is connected to the node 7, to which is also connected the base terminal of the output transistor Q4, while the collector terminal of the transistor Q1 is grounded. The other terminal of resistor R1 is connected to node 12, to which is also connected the base of a second limiting transistor Q2 and a first terminal of the second resistor R2. The emitter terminal of the transistor Q2 is connected to the node 8, to which is also connected the base terminal of the output transistor Q5, while the collector terminal of the transistor Q2 is connected to Vs power supply. The second terminal of resistor R2 is grounded.

In operation the output stage 1 shown in FIG. 4 provides an output signal $V_{out}$ on the output terminal 4 responsive to an input signal $V_{in}$ applied to the input terminal 3.

The input signal $V_{in}$ is applied to the base of the input transistor Q3 which drives the base terminals of the source and sink transistors Q4 and Q5. The current generator 9 supplies a constant current I2 into the two serially connected diodes D1 and D2 and provides a turn-on bias for the output transistors. The base-emitter junctions of transistors Q4 and Q5 in fact are biased at approximately 0.65 V to avoid crossover distortion typical of class B amplifiers.

In a normal class AB output stage the output transistors are free to saturate if the voltage present on their base terminals exceeds certain maximum values, causing the undesired delay times cited in the background.

According to the present invention the voltages present on the nodes 7 and 8, to which are connected the base terminals of the output transistors Q4 and Q5, are clamped by the clamping circuit leg 2. The current generator 10 sets up a reference current I1 that flows through the two serially connected resistors R1 and R2, developing voltage drops across these resistors that are fairly independent from the power supply Vs. For example we can set the current generator 10 and the resistors R1 and R2 to obtain a first voltage reference $V_{ref1}$=6.4 V on the node 11 and a second voltage reference $V_{ref}$=3.6 V on the node 12. It can already be seen that these two voltage references can be realized in different ways without going outside the scope of this invention and that these references can be set to any value desired within the boundaries of the headroom available.

To explain the operation of the two clamping transistors Q1 and Q2, we can examine first the case in which the upper output transistor Q4 is driven high and then the corresponding case where the lower output transistor Q5 is driven low.

The voltage on the node 7, to which is connected to base of transistor Q4, is related to the voltage $V_{out}$ on the output node 4 by the base-emitter voltage $V_{be4}$ of the transistor Q4. Since this transistor is always biased on, by the biasing circuit 6, its base-emitter voltage $V_{be4}$ is constant and equals approximately 0.65 V. If the voltage on the node 7 exceeds one $V_{be}$ drop above the voltage $V_{ref1}$, present on node 11, the transistor Q1 turns on and the voltage across its base and emitter terminal is maintained constant at $V_{be1}$=0.65 V approximately. Therefore the output voltage is limited to a voltage $V_{out\ max}$ the highest voltage that the output can attain, that may be determined as follows:

$$V_{out\ max} = V_{ref1} - (V_{be1} + V_{be4})$$

Since base-emitter drop of NPN type (Q4) and PNP type (Q1) transistors have opposite values, the term $(V_{be1}+V_{be4})$ equals approximately to zero and we obtain:

$$V_{out\ max} = V_{ref1}$$

The lower clamping is achieved via the same means, the voltage on the node 8, to which is connected the base of transistor Q5, is related to the voltage $V_{out}$ on the output node 4 by the base-emitter voltage $V_{be5}$ of the transistor Q4. Since this transistor is always biased on, by the biasing circuit 6, its base-emitter voltage $V_{be5}$ is constant and equals approximately to 0.65 V. If the voltage on the node 8 becomes one $V_{be}$ drop lower than the voltage $V_{ref2}$ present on node 12, the transistor Q2 turns on and the voltage across its base and emitter terminal is maintained constant at $V_{be2}$=0.65 V approximately. Therefore the lowest voltage that the output can attain may be determined as follows:

$$V_{out\ min}=V_{ref2}-(V_{be2}+V_{be5})$$

Since base-emitter drop of NPN type (Q2) and PNP type (Q5) transistors have opposite values, the term $(V_{be2}+V_{be5})$ equals approximately zero and we obtain:

$$V_{out\ min}=V_{ref2}$$

Therefore the output voltage $V_{out}$ is clamped within the two voltages $V_{ref1}$ and $V_{ref2}$ as follows:

$$V_{ref1}<V_{out}<V_{ref2}$$

in our case:

3.6 Volts $<V_{out}<$6.4 Volts.

Moreover the temperature coefficients of the $V_{be}$ drops on NPN and PNP transistors cancel each other out and the accuracy deficiency due to temperature is also addressed.

Furthermore, the clamping voltages can be easily set to any value desired within the boundaries of the headroom available and they are independent from the supply voltage.

Other variants may be thought up by those skilled in the art without going outside the scope of the invention as defined by the claims which follow. In particular it should be noted that, even if in the embodiment illustrated by way of an example in the drawings the output transistors, the input transistor and the limiting transistors have been seen in the forms of bipolar transistors, the invention is still usable without any conceptual modifications even with other types of transistors such as MOS transistors.

An amplifier output stage according to this invention can also be useful in any application where saturation of the output stage is undesiderable, in particular in high speed applications in which control loops need fast transient response.

I claim:

1. An amplifier output stage, connected between a first power terminal at a first voltage and a second power terminal at a second voltage, for generating an output signal on an output terminal responsive to an input signal on an input terminal, comprising:

an output leg having first and second serially connected output transistors, each having first and second terminals and a control terminal, said first output transistor being of one polarity type and being connected between said first power terminal and said output terminal, said second output transistor being of a polarity type opposite to said one polarity type and being connected between said output terminal and said second power terminal;

an input leg having, serially connected between said first and second power terminals, a first current generator, first and second semiconductor junction elements, and an input transistor driven by said input signal, the serial connection between the first current generator and the first semiconductor junction element being connected to the control terminal of said first output transistor, and the serial connection between the second semiconductor junction element and the input transistor being connected to the control terminal of said second output transistor; and a clamping circuit including first and second limiting transistors for limiting the voltage on the output terminal between first and second voltage references, said first limiting transistor being connected to the control terminal of said first output transistor and being driven by said first voltage reference, said second limiting transistor being connected to the control terminal of said second output transistor and being driven by said second voltage reference, said first limiting transistor being of said opposite polarity type and said second limiting transistor being of said one polarity type.

2. The output stage of claim 1 wherein the first limiting transistor has first and second terminals and a control terminal, said first terminal being connected to the control terminal of the first output transistor, said second terminal being connected to said second power terminal and said control terminal being connected to the first voltage reference, and wherein the second limiting transistor has first and second terminals and a control terminal, said first terminal being connected to the control terminal of the second output transitor, said second terminal being connected to said first power terminal and said control terminal being connected to the second voltage reference.

3. The output stage of claim 2 wherein the first and the second voltage references are generated by means of a second constant current generator connected in series with first and second resistors between said first and second power terminals, respectively on the serial connection between the second current generator and the first resistor and on the serial connection between the first and the second resistor.

4. The output stage of claim 1 wherein the transistors are bipolar transistors, said one polarity type being NPN and said opposite polarity type being PNP.

5. The output stage of claim 1 wherein said first and second semiconductor junction elements are diodes.

6. The output stage of claim 1 wherein the input transistor is of said one polarity type.

7. The amplifier output stage of claim 1 wherein the output stage operates in class AB.

8. A disk system having a circular media, a motor for rotating said media, read/write heads, and a circuit for positioning said read/write heads, wherein said circuit for positioning said read/write heads comprises:

a voice coil motor;

at least one power output stage for driving the voice coil motor;

an amplifier used in a control loop to determine the difference between a known reference and a feedback signal proportional to a current flowing in the voice coil motor, including:

an output stage having an output terminal and at least two output transistors serially connected between the first and second power terminals, each output transistor having first and second terminals and a control terminal, said first and second output transistors being connected together at said output terminal; and a clamping circuit including first and second limiting transistors connected to drive the respective control terminals of the output transistors to limit the voltage on said output terminal between first and second voltage references, said first limiting transistor being driven by said first voltage reference and being opposite in polarity from the polarity of said first output transistor said second limiting transistor being driven by said second voltage reference and being opposite in polarity from the polarity of said second output transistor.

9. The system of claim 8 wherein the circuit comprises:

first limiting transistor has first and second terminals and a control terminal, said first terminal being connected to the control terminal of the first output transistor, said second terminal being connected to said second power terminal and said control terminal being connected to the first voltage reference, and wherein the second limiting transistor has first and second terminals and a control terminal, said first terminal being connected to the control terminal of the second output transitor, said second terminal being connected to said first power terminal and said control terminal being connected to the second voltage reference.

10. The system of claim 9 wherein the first and the second voltage references are generated by means of a first constant current generator connected in series with first and second resistors between said first and second power terminals, respectively on the serial connection between the first current generator and the first resistor and on the serial connection between the first and the second resistor.

11. The system of claim 9 wherein the first limiting transistor is a PNP type bipolar transistor and the second limiting transistor is an NPN type bipolar transistor.

12. The system of claim 8 further comprising, serially connected between said first and second power terminals, a second current generator, first and second diodes and an input transistor, the serial connection between the second current generator and the first diode being connected to the control terminal of said first output transistor and the serial connection between the second diode and the input transistor being connected to the control terminal of said second output transistor.

13. The system of claim 8 wherein the first output transistor is an NPN type bipolar transistor and the second output transistor is a PNP type bipolar transistor.

14. The system of claim 8 wherein the output stage operates in class AB.

* * * * *